(12) United States Patent
Morishita et al.

(10) Patent No.: US 7,683,652 B2
(45) Date of Patent: Mar. 23, 2010

(54) LOW-VOLTAGE DETECTION CIRCUIT

(75) Inventors: Naoto Morishita, Gunma (JP); Kazuo Hotaka, Saitama (JP)

(73) Assignee: Sanyo Electric Co., Ltd, Osaka (JP)

( * ) Notice: Subject to any disclaimer, the term of this patent is extended or adjusted under 35 U.S.C. 154(b) by 315 days.

(21) Appl. No.: 11/812,509

(22) Filed: Jun. 19, 2007

(65) Prior Publication Data

US 2008/0012604 A1 Jan. 17, 2008

(30) Foreign Application Priority Data

Jun. 20, 2006 (JP) .............................. 2006-169831

(51) Int. Cl.
*G01R 31/36* (2006.01)
*G01R 31/02* (2006.01)

(52) U.S. Cl. ...................... 324/771; 324/537

(58) Field of Classification Search ................. 324/771, 324/537
See application file for complete search history.

(56) References Cited

U.S. PATENT DOCUMENTS

| 5,120,142 | A | * | 6/1992 | Fujiwara et al. .......... 400/157.2 |
| 5,218,362 | A | | 6/1993 | Mayes et al. |
| 6,236,249 | B1 | | 5/2001 | Choi et al. |
| 6,737,850 | B2 | * | 5/2004 | Kushiyama ................. 324/72 |

FOREIGN PATENT DOCUMENTS

JP 2002-372554 12/2002
KR 10-0301368 1/2000

* cited by examiner

*Primary Examiner*—Amy He
(74) *Attorney, Agent, or Firm*—Morrison & Foerster LLP

(57) ABSTRACT

A low-voltage detection circuit detects a low voltage using a voltage follower type operational amplifier and an A/D converter instead of a conventional low-voltage detection circuit. That is, a reference voltage is applied from a reference voltage generating circuit to the A/D converter through the voltage follower type operational amplifier. The voltage follower type operational amplifier is used to reduce output impedance. The power supply voltage can be detected by a converted value (a digital value) from the A/D converter since the reference voltage is independent of the power supply voltage and the converted value varies depending on the power supply voltage. The converted value (the digital value) from the A/D converter is set in a register and statuses of a microcomputer are set as in the conventional art, using the converted value as a flag.

4 Claims, 5 Drawing Sheets

LOW-VOLTAGE DETECTION CIRCUIT

CROSS-REFERENCE OF THE INVENTION

This application claims priority from Japanese Patent Application No. 2006-169831, the content of which is incorporated herein by reference in its entirety.

BACKGROUND OF THE INVENTION

1. Field of the Invention

This invention relates to a low-voltage detection circuit to detect reduction in a power supply voltage that is supplied to a semiconductor integrated circuit.

2. Description of the Related Art

A microcomputer conventionally incorporates a low-voltage detection reset circuit that detects reduction in the power supply voltage and generates a reset signal and a low-voltage detection circuit to detect the reduction in the power supply voltage in advance of the generation of the reset signal in order to set various statuses of the microcomputer.

FIG. 5 is a circuit diagram of such a low-voltage detection circuit. A programmable low-voltage detection circuit 10 is provided with a first comparator circuit 11 and a first detection level setting circuit 13 capable of variably setting a first detection level that corresponds to the power supply voltage Vdd. A reference voltage Vref (1.0 V–1.5 V) that is independent of the power supply voltage Vdd is applied from a reference voltage generating circuit 14 to a positive terminal (+) of the first comparator circuit 11. The first detection level is applied from the first detection level setting circuit 13 to a negative terminal (−) of the first comparator circuit 11. The reference voltage generating circuit 14 can be made of a so-called band gap type reference voltage generating circuit.

The first detection level from the first detection level setting circuit 13 can be set at any of $2^n$ levels corresponding to n bits of control signals from a register 15. Control data is set in the register 15 through bus lines 16 of the microcomputer. If the first detection level is set so as to be the reference voltage Vref when the power supply voltage Vdd is 2.5 V, for example, the first comparator circuit 11 outputs a reset signal of a high level when the power supply voltage Vdd drops to 2.5 V or below. The microcomputer is reset by the reset signal.

A low-voltage detection circuit 20 is provided with a second comparator circuit 21 and a second detection level setting circuit 22 capable of variably setting a second detection level that corresponds to the power supply voltage Vdd. The reference voltage Vref is applied from the reference voltage generating circuit 14 to a positive terminal (+) of the second comparator circuit 21. The second detection level is applied from the second detection level setting circuit 22 to a negative terminal (−) of the second comparator circuit 21. The second detection level set by the second detection level setting circuit 22 is usually set to be larger than the first detection level set by the first detection level setting circuit 13. An output of the second comparator 21 is inputted to and retained in a register 23 which is connected to the bus lines 16.

With the circuit described above, when the power supply voltage Vdd is reduced so that the second detection level becomes equal to or lower than the reference voltage Vref, the low-voltage detection circuit 20 detects it and sets the register 23. And the statuses of the microcomputer are set using data set in the register 23 as a flag. For example, the microcomputer is set in a HALT mode or data is saved. When the power supply voltage Vdd is farther reduced so that the first detection level becomes equal to or lower than the reference voltage Vref, the programmable low-voltage detection reset circuit 10 generates the reset signal and the microcomputer is reset. Therefore, with the circuit described above, it is made possible that the reduction in the power supply voltage Vdd is detected to set the statuses of the microcomputer in advance of the generation of the reset signal.

With the circuit described above, however, there is a problem that a size of the circuit is increased because the low-voltage detection circuit 20 dedicated to detect the reduction in the power supply voltage Vdd is required.

SUMMARY OF THE INVENTION

This invention is directed to solve the problem addressed above, and offers a low-voltage detection circuit that includes a reference voltage generating circuit to generate a reference voltage which is independent of a power supply voltage and an A/D converter to convert the reference voltage to a digital value and detects the power supply voltage based on the digital value outputted by the A/D converter.

According to this invention, the power supply voltage can be detected from the converted value (the digital value) by the A/D converter since the reference voltage (an analog value) is independent of the power supply voltage and the converted value varies depending on the power supply voltage.

DETAILED DESCRIPTION OF THE INVENTION

Figure 1:
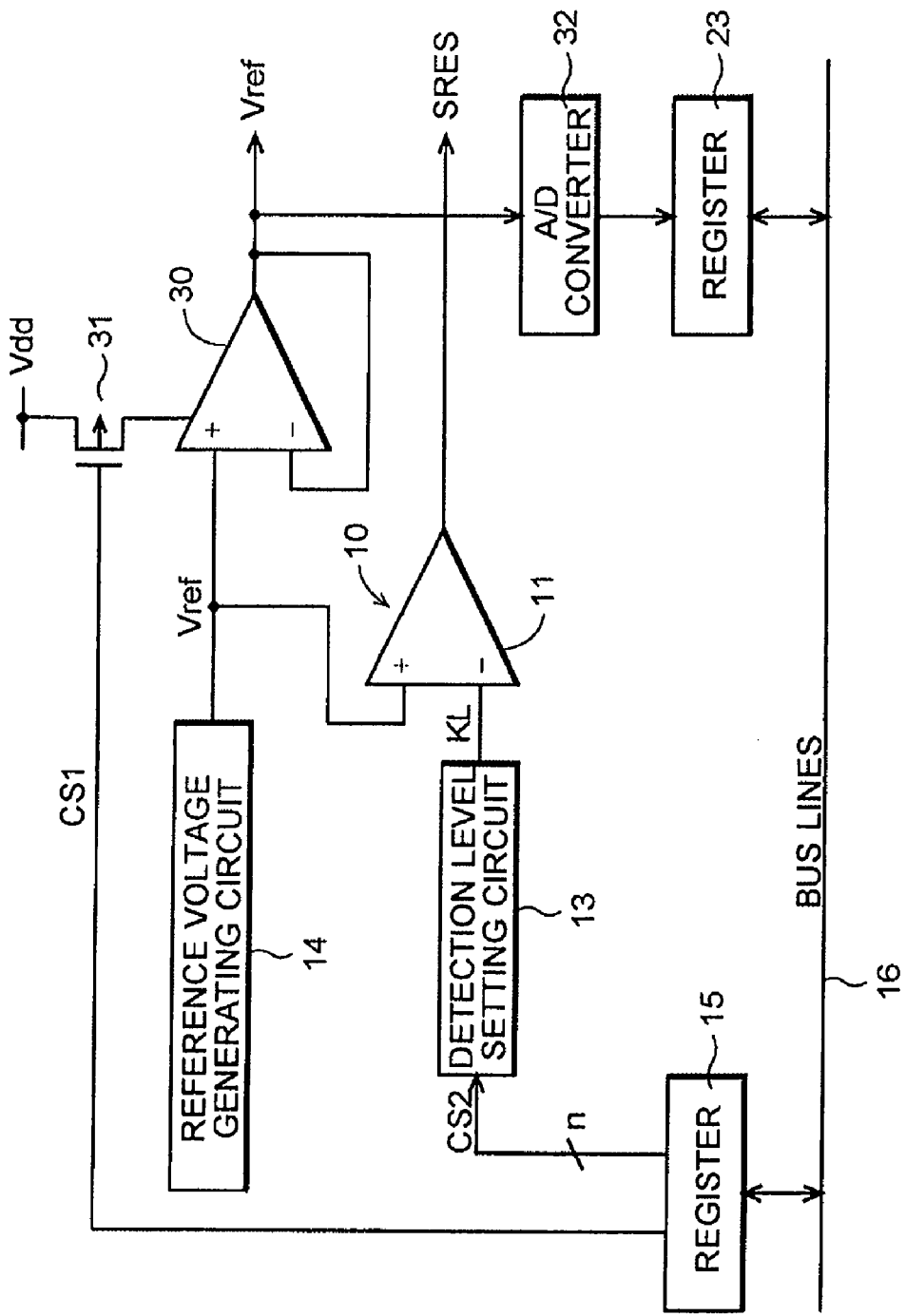
FIG. 1 is a circuit diagram of a low-voltage detection circuit according to an embodiment of this invention.

Next, a low-voltage detection circuit according to an embodiment of this invention will be described referring to the drawings. The low-voltage detection circuit according to the embodiment of this invention converts a reference voltage Vref generated by a reference voltage generating circuit to a converted value (a digital value) through an A/D conversion by an A/D converter, and detects a power supply voltage Vdd based on the converted value. A concrete structure of the circuit is described hereafter, referring to FIG. 1 through FIG. 3.

A programmable low-voltage detection circuit 10 is provided with a comparator circuit 11 and a detection level setting circuit 13 capable of variably setting a detection level that corresponds to the power supply voltage Vdd, as shown in FIG. 1. The reference voltage Vref (1.0 V–1.5 V) that is independent of the power supply voltage Vdd is applied from a reference voltage generating circuit 14 to a positive terminal (+) of the comparator circuit 11. The detection level is applied from the detection level setting circuit 13 to a negative terminal (−) of the comparator circuit 11.

The low-voltage detection circuit according to the embodiment of this invention detects a low voltage using a voltage follower type operational amplifier 30 and an A/D converter 32 instead of the conventional low-voltage detection circuit 20. That is, the reference voltage Vref is applied from the reference voltage generating circuit 14 to the A/D converter 32 through the voltage follower type operational amplifier 30. The voltage follower type operational amplifier 30 is used to reduce output impedance. The power supply voltage Vdd can be detected by a converted value (a digital value) by the A/D converter 32 since the reference voltage Vref is independent of the power supply voltage Vdd and the converted value varies depending on the power supply voltage Vdd. The converted value (the digital value) by the A/D converter 32 is set in a register 23 and statuses of a microcomputer are set as in the conventional art, using the converted value as a flag.

The voltage follower type operational amplifier 30 is activated when a PMOS 31 is turned on and deactivated when it is turned off. Turning on/off of the PMOS 31 is controlled by a control signal CS1 from the register 15. The voltage follower type operation amplifier 30 is incorporated in the microcomputer for the purpose of testing and the A/D converter 32 is also incorporated in the microcomputer usually as a peripheral circuit. A low-voltage detection circuit that is small in size and high in accuracy can be offered by utilizing them.

Figure 2:
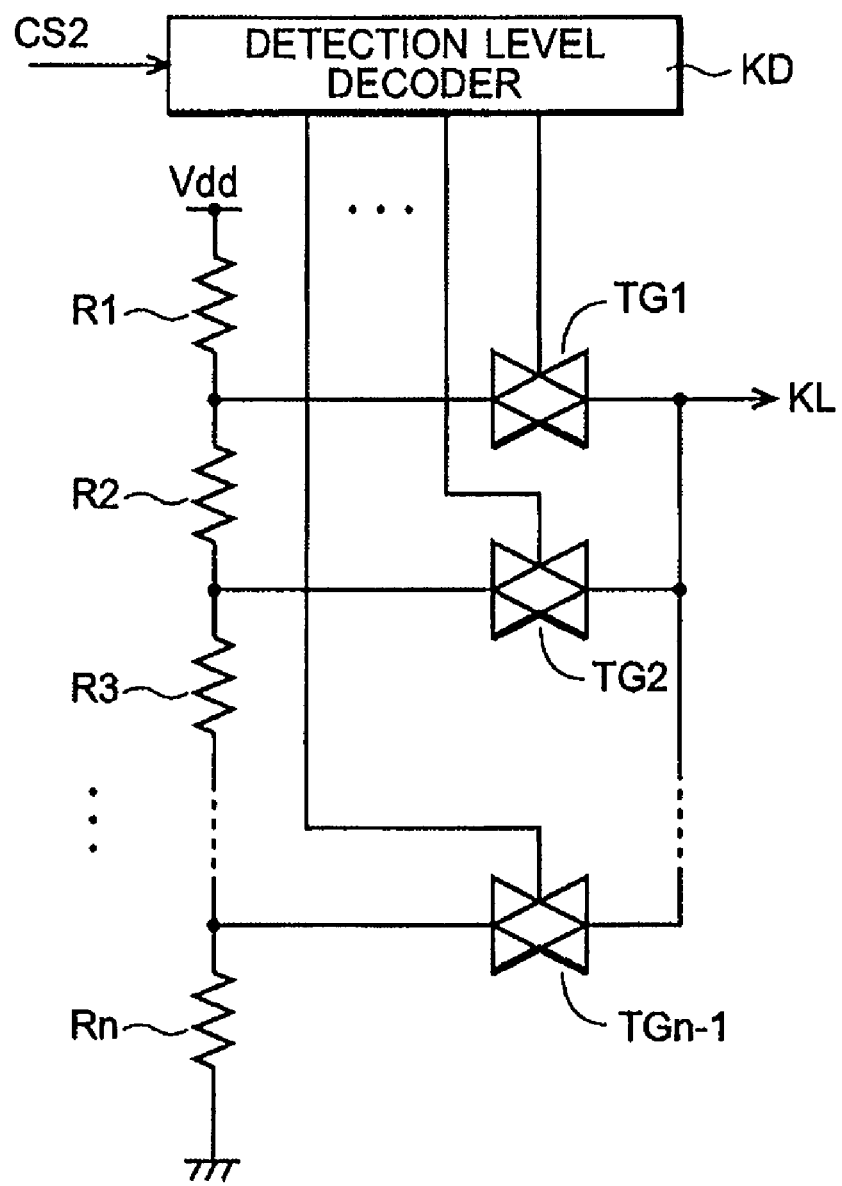
FIG. 2 is a circuit diagram of a detection level setting circuit.

An example circuit of the detection level setting circuit 13 will be described referring to FIG. 2. The circuit is provided with n ladder resistors R1, R2 . . . Rn that divide the power supply voltage Vdd, (n−1) transmission gates TG1, TG2 . . . TGn−1 through which the detection level that is a voltage at each of connecting nodes between the ladder resistors, and a detection level decoder KD that controls turning on/off of the transmission gates TG1, TG2 . . . TGn−1 in response to a control signal CS2 from the register 15.

Figure 3:
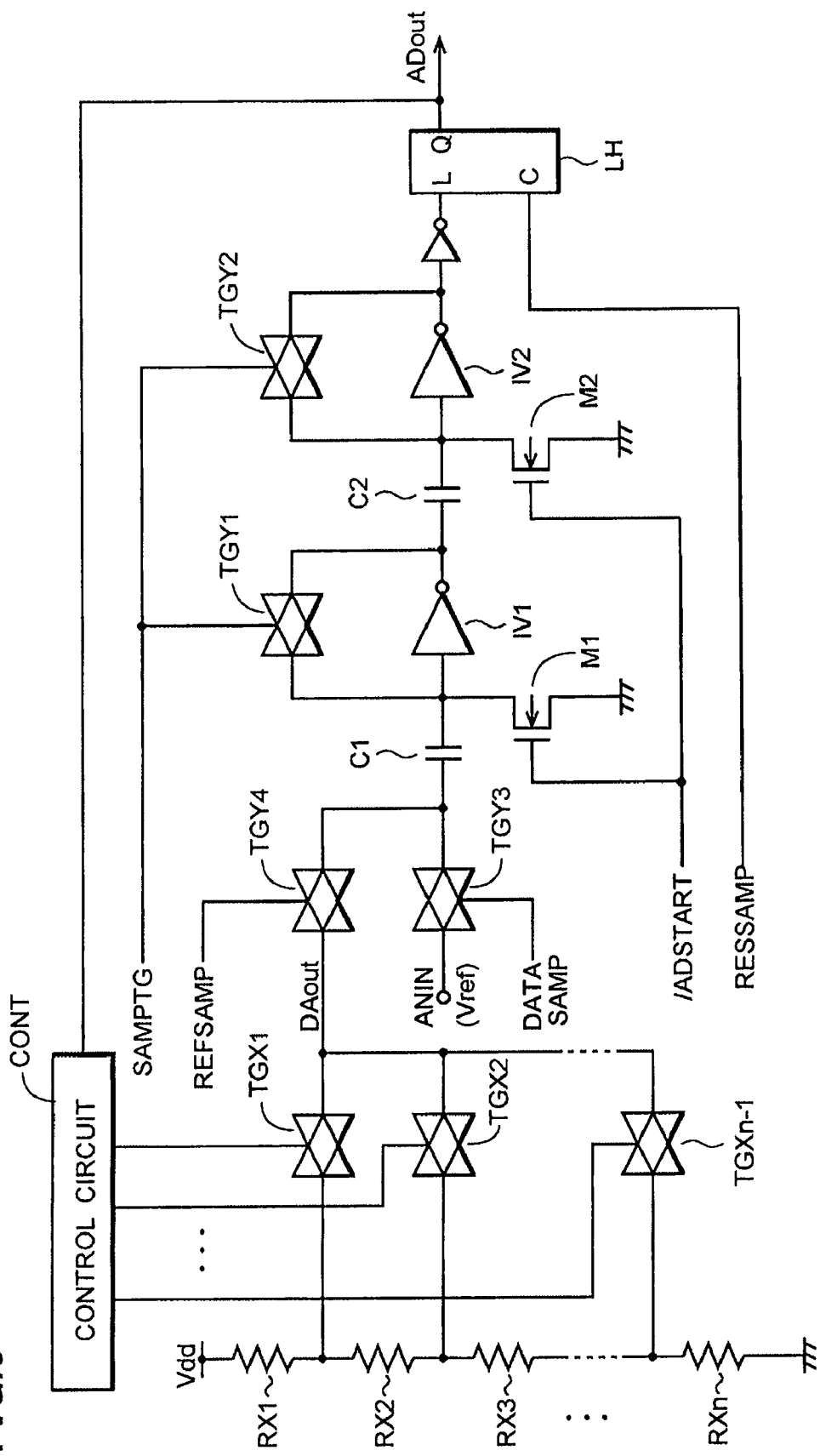
FIG. 3 is a circuit diagram of an A/D converter.

Next, an example circuit of the A/D converter 32 will be described referring to FIG. 3. The A/D converter 32 uses a comparator and a D/A converter using ladder resistors. The D/A converter is composed of n ladder resistors RX1, RX2 . . . RXn that divide the power supply voltage Vdd, (n−1) transmission gates TGX1, TGX2 . . . TGXn−1 through which a voltage at each of connecting nodes between the ladder resistors is taken out as an output voltage DAout and a control circuit CONT that turns on the transmission gates TGX1, TGX2 . . . TGXn−1 selectively in response to a result of the D/A conversion.

The comparator has a function to compare the output voltage DAout with an analog input voltage ANIN (=the reference voltage Vref) and is composed of two stages of chopper type comparators. A first stage chopper type comparator is composed of a transmission gate TGY3 that is turned on in response to a data sampling signal DATASAMP to apply the analog input voltage ANIN (=the reference voltage Vref) to a first capacitor C1, a transmission gate TGY4 that is turned on in response to a reference sampling signal REFSAMP to apply the output voltage DAout to the first capacitor C1, a first inverter IV1 connected with the first capacitor C1, a transmission gate TGY1 that is turned on in response to a sampling signal SAMPTG to short-circuit an input and an output of the first inverter IV1 and a first NMOS M1 that is turned on and off in response to an A/D conversion start signal /ADSTART.

A second stage chopper type comparator is provided in order to amplify an output of the first stage chopper type comparator and is composed of a second capacitor C2 to which the output of the first inverter IV1 is applied, a second inverter IV2 connected with the second capacitor C2, a transmission gate TGY2 that is turned on in response to the sampling signal SAMPTG to short-circuit an input and an output of the second inverter IV2 and a second NMOS M2 that is turned on and off in response to the A/D conversion start signal /ADSTART.

And there is provided a latch circuit LH to latch an output of the second stage chopper type comparator based on an A/D conversion result sampling signal RESSAMP. The control circuit CONT turns on the transmission gates TGX1, TGX2 . . . TGXn−1 selectively in response to an output of the latch circuit LH.

Figure 4:
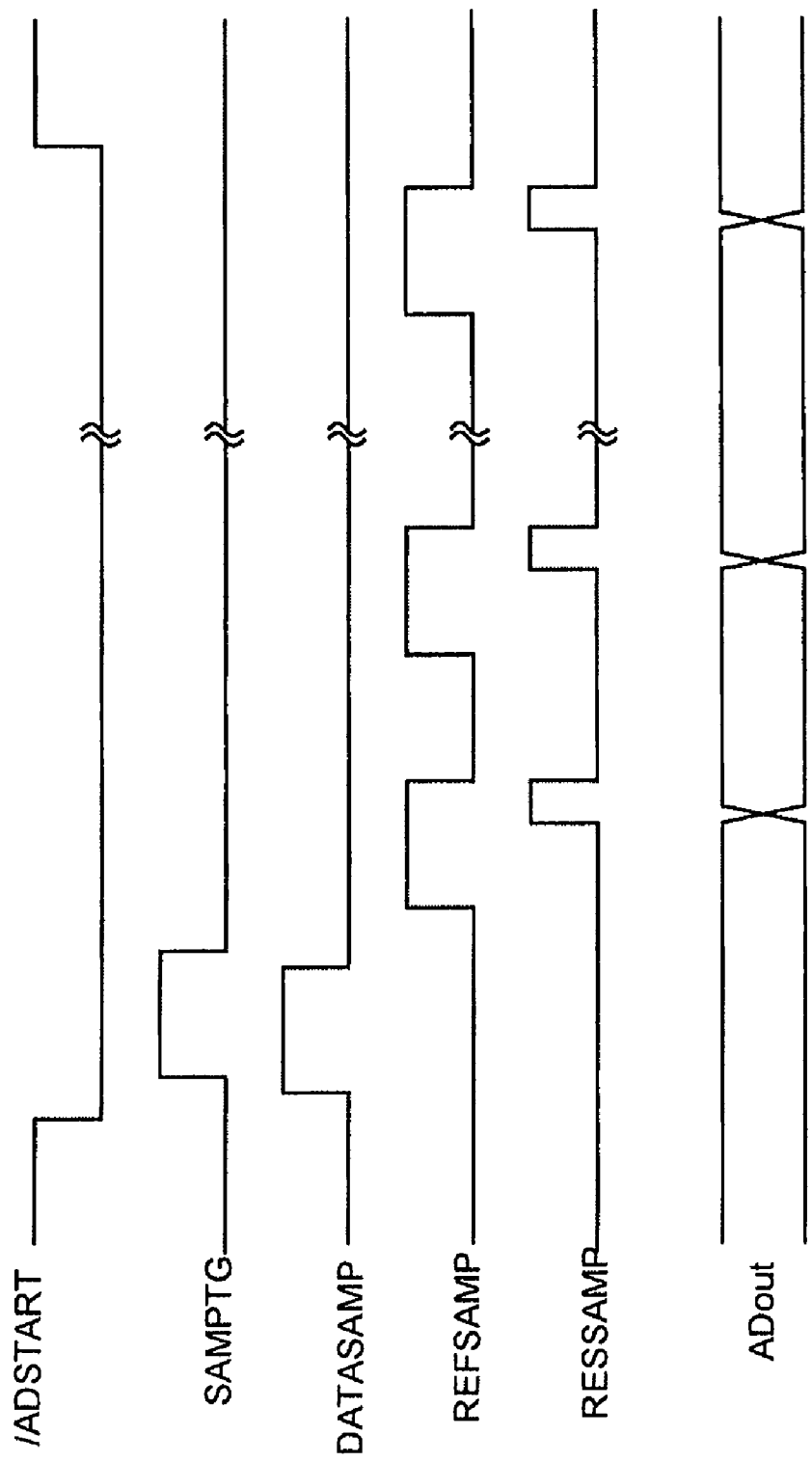
FIG. 4 is a timing chart showing operation of the A/D converter.
Figure 5:
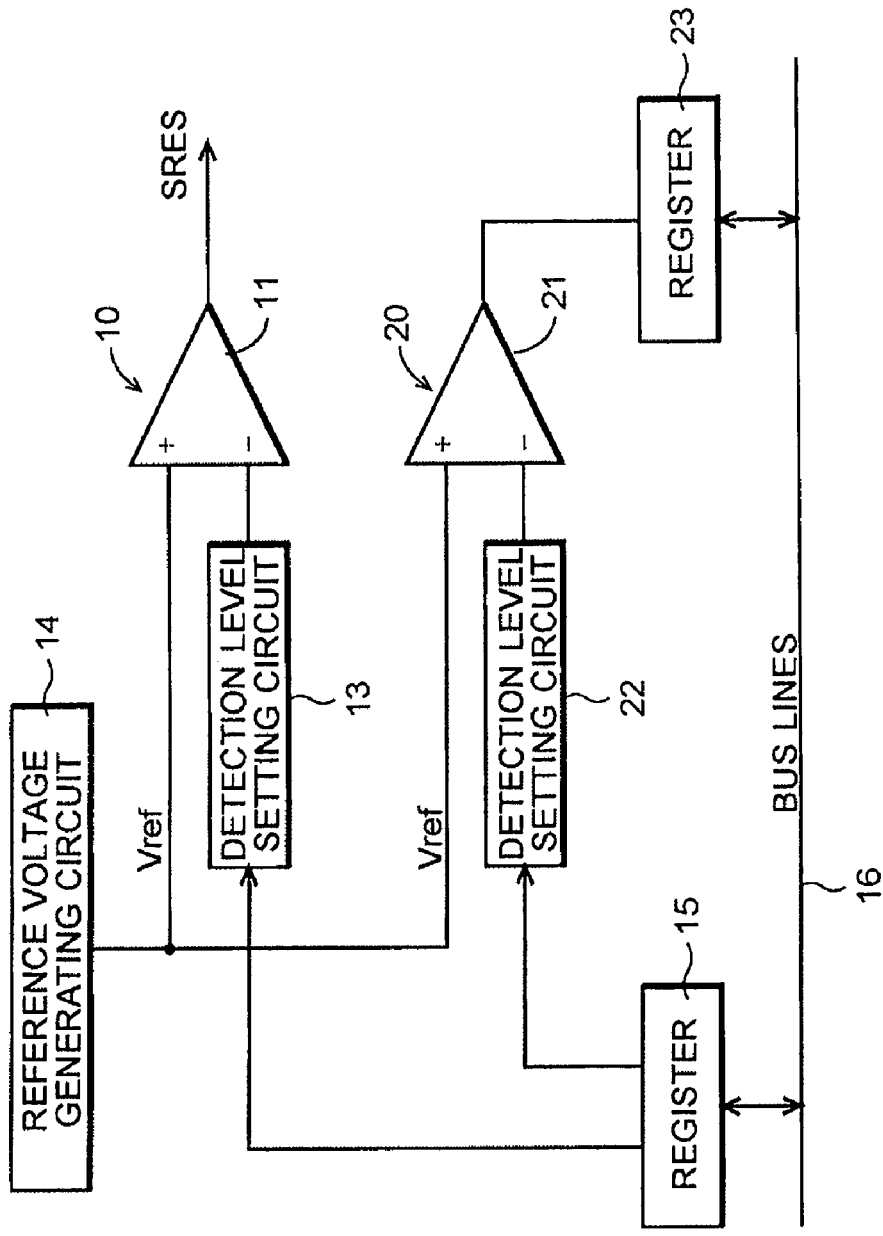
FIG. 5 is a circuit diagram of a conventional low-voltage detection circuit.

Operation of the A/D converter 32 will be described referring to a timing chart shown in FIG. 4. Before starting the A/D conversion, the A/D conversion start signal /ADSTART is at a high level, the first NMOS M1 and the second NMOS M2 are turned on and the inputs to the first inverter IV1 and the second inverter IV2 are fixed at a low level (a ground voltage). A through-current is thereby prevented from flowing through the first inverter IV1 or the second inverter IV2.

After that, when the A/D conversion start signal /ADSTART turns to the low level, the first NMOS M1 and the second NMOS M2 are turned off. And when the data sampling signal DATASAMP and the sampling signal SAMPTG are turned to the high level sequentially, the transmission gate TGY3 is turned on to apply the analog input voltage ANIN (=the reference voltage Vref) to an input terminal of the first capacitor C1, and each of the transmission gates TGY1 and TGY2 is turned on to short-circuit the input and the output of each of the first and second inverters IV1 and IV2, respectively. As a result, the input of the first inverter IV1 is set at a threshold voltage Vt1 of the first inverter IV1 and the input of the second inverter IV2 is set at a threshold voltage Vt2 of the second inverter IV2. With this, the first capacitor C1 is charged to a voltage of (Vref−Vt1).

After that, when the data sampling signal DATASAMP and the sampling signal SAMPTG are turned to the low level sequentially, the transmission gate TGY3 and the transmission gates TGY1 and TGY2 are turned off. After that, when the reference sampling signal REFSAMP is turned to the high level, the transmission gate TGY4 is turned on to apply the output voltage DAout of the D/A converter to the input terminal of the first capacitor C1. At that time, the output voltage DAout is set at Vdd/2 by the control circuit CNT.

Since the input terminal of the first capacitor C1 varies from Vref to Vdd/2, an output terminal of the first capacitor C1, which is the input of the first inverter IV1, is thereby changed to (Vdd/2−Vref+Vt1). With this, Vref is compared with Vdd/2 by the first inverter IV1. That is, the first inverter IV1 outputs the high level in the case where Vref>Vdd/2, and outputs the low level in the case where Vref<Vdd/2. The output of the first inverter IV1 is amplified by the second stage chopper type comparator and latched in the latch circuit LH based on a rise of the A/D conversion result sampling signal RESSAMP. With this, a most significant bit (MSB) of Vref is determined.

After that, the reference sampling signal REFSAMP sequentially turns to the high level and the D/A converter sequentially outputs the output voltage DAout corresponding to the result of the A/D conversion of the higher bit, and Vref is compared with it sequentially. For example, if the result of the first comparison shows Vref>Vdd/2, the output voltage DAout in a second comparison becomes ¾Vdd which is compared with Vref to determine a bit of (MSB−1). Vref is converted to a digital value of n bits as described above. When the power supply voltage Vdd is reduced, the digital value becomes larger because the output voltage DAout becomes smaller. When the power supply voltage Vdd is increased, the digital value becomes smaller because the output voltage DAout becomes larger. Therefore, the power supply voltage Vdd can be detected based on the digital value obtained from the results of the A/D conversion.

According to the embodiment of this invention, it is made possible to realize the low-voltage detection circuit which is small in size and accurate in detecting the reduction in the power supply voltage, because it detects the reduction in the power supply voltage utilizing the A/D converter incorporated in a microcomputer or the like.

What is claimed is:

1. A low-voltage detection circuit, comprising:
   a reference voltage generating circuit generating a reference voltage that is independent of a power supply voltage; and
   an A/D converter converting the reference voltage to a digital value,
   wherein the power supply voltage is detected based on the digital value outputted by the A/D converter, and
   the A/D converter comprises ladder resistors that divide the power supply voltage to a plurality of divided voltages, a comparator that compares the reference voltage into one of the divided voltages and a control circuit that selects one of the divided voltages in response to a result of a comparison performed by the comparator.

2. The low-voltage detection circuit of claim 1, further comprising a voltage follower type operational amplifier, wherein the reference voltage outputted from the reference voltage generating circuit is applied to the A/D converter through the voltage follower type operational amplifier.

3. The low-voltage detection circuit of claim 1, further comprising a detection level setting circuit configured to variably set a detection level that corresponds to the power supply voltage and a low-voltage detection reset circuit that outputs a reset signal when the detection level is equal to or lower than the reference voltage.

4. The low-voltage detection circuit of claim 2, further comprising a detection level setting circuit configured to variably set a detection level that corresponds to the power supply voltage and a low-voltage detection reset circuit that outputs a reset signal when the detection level is equal to or lower than the reference voltage.

* * * * *